(12) United States Patent
Athas et al.

(10) Patent No.: US 7,378,003 B2
(45) Date of Patent: *May 27, 2008

(54) THIN-FILM MAGNETIC RECORDING HEAD MANUFACTURE USING SELECTIVE IMAGING

(75) Inventors: Gregory J. Athas, Newton, MA (US); Russel Mello, Wakefield, MA (US)

(73) Assignee: FEI Company, Hillsboro, OR (US)

( * ) Notice: Subject to any disclaimer, the term of this patent is extended or adjusted under 35 U.S.C. 154(b) by 420 days.

This patent is subject to a terminal disclaimer.

(21) Appl. No.: 10/999,908

(22) Filed: Nov. 30, 2004

(65) Prior Publication Data

US 2005/0139320 A1    Jun. 30, 2005

Related U.S. Application Data

(60) Continuation of application No. 10/024,639, filed on Dec. 18, 2001, now Pat. No. 6,824,644, which is a division of application No. 09/070,559, filed on Apr. 30, 1998, now Pat. No. 6,332,962, which is a continuation-in-part of application No. 08/877,019, filed on Jun. 16, 1997, now abandoned, and a continuation-in-part of application No. 08/874,497, filed on Jun. 13, 1997, now abandoned.

(51) Int. Cl.
*C23C 14/34* (2006.01)

(52) U.S. Cl. ............................ 204/192.32; 204/192.33; 204/192.34; 216/59; 216/60; 216/66

(58) Field of Classification Search ........... 204/192.32, 204/192.33, 192.34; 216/59, 60, 66
See application file for complete search history.

(56) References Cited

U.S. PATENT DOCUMENTS 4,457,803 A     7/1984   Takigawa
(Continued)

FOREIGN PATENT DOCUMENTS

EP          0 452 846 A2   10/1991
(Continued)

OTHER PUBLICATIONS

Athas, Gregory J. et al., "Focused Ion Beam System for Automated MEMS Photocopying and Processing." (1997).
(Continued)

*Primary Examiner*—Rodney G. McDonald
(74) *Attorney, Agent, or Firm*—Scheinberg & Griner, LLP; Michael O. Scheinberg

(57) ABSTRACT

A focused particle beam system, according to one embodiment of the invention, precisely shapes a pole-tip assembly formed by a multi-layer device having a first layer with a first structural element, a second layer with a second structural element, and a shielding layer with a shielding element, the shielding element being located between the first layer and the second layer. The focused particle beam system mills the second structural element without irradiating a first structural element. The system images a selected portion of the multi-layer device to locate the shielding element and thereby avoids irradiating the first structural element. The shielding element separates the first structural element from the second structural element. Based on the location of the shielding element, the system images and mills the second structural element without irradiating the first structural element. In this manner, the focused particle beam system mills the second structural element to produce a desired pole-tip configuration. By producing a desired pole-tip configuration, these methods and apparatus produce a recording transducer capable of high storage density.

16 Claims, 7 Drawing Sheets

U.S. PATENT DOCUMENTS

| | | |
|---|---|---|
| 4,874,947 A | 10/1989 | Ward et al. |
| 5,079,662 A | 1/1992 | Kawakami et al. |
| 5,157,570 A | 10/1992 | Shukovsky et al. |
| 5,314,596 A | 5/1994 | Shukovsky et al. |
| 5,401,972 A | 3/1995 | Talbot et al. |
| 5,404,635 A | 4/1995 | Das |
| 5,452,166 A | 9/1995 | Aylwin et al. |
| 5,495,378 A | 2/1996 | Bonyhard et al. |
| 5,616,921 A | 4/1997 | Talbot et al. |
| 5,916,424 A | 6/1999 | Libby et al. |
| 6,004,437 A | 12/1999 | Lee et al. |
| 6,332,962 B1 * | 12/2001 | Athas et al. ............ 204/192.34 |
| 6,354,438 B1 | 3/2002 | Lee et al. |
| 6,521,902 B1 | 2/2003 | Chang et al. |
| 6,824,644 B2 | 11/2004 | Athas et al. |

FOREIGN PATENT DOCUMENTS

| | | |
|---|---|---|
| GB | 2 166 888 A | 5/1986 |
| GB | 2 227 601 A | 1/1990 |
| GB | 2 227 601 A | 8/1990 |

OTHER PUBLICATIONS

Futamoto, Masaaki et al., "Development of Technologies for 2-Gb/in2 Areal Density Recording." Electronics and Communications in Japan, Part II-Electronics. vol. 76. No. 3 (Mar. 1993) pp. 94-103.
Mallinson, John C. "Magneto-Resistive Heads. Fundamentals and Applications." Academic Press, Inc., San Diego Chapter 8, pp. 66-78 and Chapter 14, pp. 110-119 (1996).

* cited by examiner

THIN-FILM MAGNETIC RECORDING HEAD MANUFACTURE USING SELECTIVE IMAGING

CROSS REFERENCES

The present application is a continuation of U.S. patent application Ser. No. 10/024,639, filed Dec. 18, 2001 and now issued as U.S. Pat. No. 6,824,644, which is a divisional of U.S. patent application Ser. No. 09/070,559, filed Apr. 30, 1998 and now issued as U.S. Pat. No. 6,332,962, which is a continuation-in-part of U.S. patent application Ser. No. 08/877,019, filed Jun. 16, 1997 and now abandoned, which is also a continuation-in-part of U.S. patent application Ser. No. 08/874,497, filed Jun. 13, 1997 and now abandoned, all of which are incorporated herein by reference.

BACKGROUND

This invention relates to apparatus and methods for manufacturing improved thin-film magnetic recording transducers, commonly referred to as recording transducers. More specifically, it relates to a focused particle beam system for milling a portion of a pole-tip assembly of the recording transducer without irradiating a sensitive structure, e.g. a read head, of the recording transducer.

Thin-film magnetic recording transducers have gained wide acceptance in the data storage industry. A recording transducer includes a write head and a read head. The recording transducer has an air bearing surface that passes adjacent to a recording medium, such as a magnetic disk. The portions of the recording transducer, including portions of the write head and of the read head, that are proximate to the air bearing surface form a small, precisely shaped pole-tip assembly. The size and shape of the pole-tip assembly, which include features on the order of one-half a micron, in part determine the magnetic field pattern produced by the recording transducer. This magnetic field pattern effects how narrowly the recording transducer can record data tracks on the magnetic media of magnetic memory storage devices, such as computer hard disks, and digital data tape drives.

Thinner data tracks allow a storage device to store more data tracks per area of media and therefore more data per device. Accordingly, precisely forming the pole-tip assembly of the recording transducer results in an increase in the total data storage capacity of a magnetic memory device. Manufacturers seek to form the geometry of a pole-tip assembly with high precision, and consequently achieve pole-tip assemblies capable of providing magnetic field patterns suitable for writing narrow tracks of recorded data.

Manufacturers presently fabricate multiple recording transducers from a single multi-layer device, and endeavor to form the precise desired shape of the pole-tip assembly of a recording transducer by employing lithographic techniques in fabricating the multi-layer device. Typically, lithographic techniques deposit alternating layers of conductive and insulating materials onto a substrate by an evaporation, sputtering, plating, or other deposition technique that provides precise control of the deposition thicknesses. Chemical etching, reactive ion etching (RIE), or other techniques shape and form the deposited layers into a pole-tip assembly having the desired geometry. Thus, a multi-layer lithographicaly fabricated device can form a plurality of recording transducers having pole-tip assemblies.

Although existing lithographic techniques work sufficiently well to provide pole-tip assemblies having feature sizes suitable for current data storage capacity, these lithographic techniques are limited as to the small feature sizes that they can produce. For example, present photolithographic techniques require precise application of photoresist layers. Commonly, the photoresist layer is applied to produce a topology that includes voids having aspect ratios of 10:1 or larger. Such topologies are difficult to achieve reliably, at the desired small sizes, using such a photoresist technique.

Thus, these lithographic techniques are poorly suited for achieving a high yield of precisely formed, ultra-small, pole-tip assemblies. In the interest of increased storage density, manufacturers decrease the dimensions of a desired pole-tip assembly. As the dimensions of the desired pole-tip assembly decrease, manufacturers who use existing lithographic techniques experience yield loss. In other words, even if manufacturers using existing lithographic techniques are successful in achieving a desired pole-tip assembly configuration, they generally achieve that desired configuration with a low yield.

The kinds of defects that occur during the manufacturing process are difficult to predict and vary widely. Accordingly, the application of a universal photoresist pattern to the surface of a pole-tip assembly is a generalized solution that often is ill suited to the actual manufacturing defect of any one recording transducer. Therefore, current techniques for producing a magnetic recording transducer have several serious limitations with respect to control of pole-tip assembly geometry.

Consequently, higher density data storage devices can require micromachining of the recording transducer used with the devices. Manufacturers can micromachine the recording transducer while it is contained in a multi-layer device. Prior to micromachining, a multi-layer device is lithographically fabricated. Once the multi-layer device is fabricated, it is cleaved at a selected location and the cleaved surface is polished to expose at least one recording transducer pole-tip assembly formed by the multi-layer device.

The micromachining of a recording transducer can require accurate shaping of a write head. However, the read head can employ a sensitive structure such as a Magneto-Resistive Stripe (MRS). A MRS can suffer damage as a result of irradiation by a focused ion beam (FIB). For background information on the design and function of a MRS and an inductive write head, see the text "Magneto-Resistive Heads, Fundamentals and Applications" by John C. Mallinson (Academic Press, Inc., San Diego 1996), incorporated herein by reference. It is important to note that the MRS and the write head can each have sublayers. An MRS can include thin-film sublayers, each five to six angstroms thick. The properties of a read head, including a MRS, can be altered during irradiation by a focused ion beam (FIB). Thus, there is a need for focused ion beam systems and methods that locate and accurately shape a write head without irradiating a read head of a pole-tip assembly of a thin-film magnetic recording transducer.

Accordingly, it is an object of the present invention to provide apparatus and methods for manufacturing improved thin-film magnetic recording transducers using a focused particle beam.

It is a further object of the present invention to precisely form the pole-tip assembly of a magnetic recording transducer without irradiating a sensitive structure, e.g., a read head, in the recording transducer.

Other objects of the invention will in part be obvious and will in part appear hereinafter.

The invention is described herein in connection with certain embodiments; however, it will be clear to those skilled in the art of magnetic recording transducer manufacture that various modifications, additions and subtractions can be made to the described embodiments without departing from the spirit or scope of the invention.

SUMMARY OF THE INVENTION

The present invention provides apparatus and methods for precisely shaping a pole-tip assembly of a magnetic recording transducer without irradiating a sensitive structure, e.g., a read head in the recording transducer. An apparatus for shaping a pole-tip assembly of a recording transducer with a focused particle beam, according to one embodiment of the invention, includes a platform for receiving a multi-layer device including the recording transducer and for disposing the multi-layer device for interaction with the focused particle beam. The multi-layer device has a first layer including a first structural element, a second layer including a second structural element, and a shielding layer including a shielding element. The first and second structural elements can be a read head and a write head, respectively. The shielding element is located between the first structural element and the second structural element. The structural elements and the shielding element intersect a geometrical surface that extends transversely to the first, second, and shielding layers, so that imaging at least a portion of the shielding element, at the geometrical surface, provides information that facilitates imaging the second structural element without imaging the first structural element.

The apparatus has an element for scanning the focused particle beam over the geometrical surface at a selected first section that includes at least a portion of the shielding element and that does not include the first structural element. The system can select which section of the multi-layer device surface to image by methods, such as an optical microscope registration technique, that are known in the art. The apparatus has an element for generating a first image signal representative of the portion of the shielding element. The first image signal results from interaction of the focused particle beam with the portion of the shielding element. The apparatus has an element for analyzing the first image signal representative of the portion of the shielding element to determine the location of the portion of the shielding element.

The apparatus has an element for directing the focused particle beam, in response to the determined location of the portion of the shielding element, to interact with the second structural element without substantially interacting with the first structural element. The apparatus has an element for generating a second image signal responsive to interaction of the focused particle beam with the second structural element. In addition, the apparatus has a processor element, responsive to the second image signal, for generating a milling signal. The milling signal represents an instruction for applying the focused particle beam to a selected portion of the second structural element for milling the selected portion of the second structural element.

One version of a method according to the present invention employs a focused particle beam to shape a pole-tip assembly of a recording transducer. The method disposes a multi-layer device on a platform for contact with the particle beam. The multi-layer device forms at least one recording transducer. As noted above, the multi-layer device has a first layer including a first structural element, a second layer including a second structural element, and a shielding layer including a shielding element located between the first structural element and the second structural element. The structural elements and the shielding element intersect a geometrical surface that extends transversely to the first, second, and shielding layers, so that imaging at least a portion of the shielding element, at the geometrical surface, provides information to facilitate imaging the second structural element without imaging the first structural element.

The system scans the focused particle beam over the geometrical surface at a selected first section that includes at least a portion of the shielding element and that does not include the first structural element. The system generates a first image signal representative of the portion of the shielding element. The first image signal results from interaction of the focused particle beam with the portion of the shielding element. The system analyzes the first image signal representative of the portion of the shielding element to determine the location of the portion of the shielding element.

The system directs, responsive to the determined location of the portion of the shielding element, the focused particle beam to interact with the second structural element without requiring interaction with the first structural element. The system generates a second image signal responsive to interaction of the focused particle beam with the second structural element. Then, the system generates, responsive to the second image signal, a milling signal. The milling signal represents an instruction for applying the focused particle beam to a selected portion of the second structural element for shaping the pole-tip assembly by milling the selected portion of the second structural element.

According to further features of the invention, the system provides a charge neutralization element for neutralizing charge on the recording transducer.

The scanning of the focused particle beam includes scanning the focused particle beam over the geometrical surface at a selected section that includes the portion of the shielding element closest to the second structural element.

The generation of a second image signal includes the generation, responsive to the second image signal, of a coordinate signal. The coordinate signal represents an instruction for applying the focused particle beam to a selected portion of the second structural element for shaping the pole-tip assembly by milling the selected portion of the second structural element.

The generation of a coordinate signal includes the detection of an edge of the second structural element and generates an edge signal. The edge signal represents a location of the edge of the second structural element relative to the focused particle beam.

The generation of a milling signal includes generating, as a function of the second image signal, a presentation signal. The presentation signal represents a pattern presentation of the second structural element. The generation of a milling signal can further include comparing the presentation signal to a pattern signal representative of a select second structural element topography. The generation of a milling signal can include comparing the presentation signal to a plurality of pattern signals and selecting one of the pattern signals as a function of the comparison.

The comparison of the presentation signal to the pattern includes the determination of an etching pattern signal representative of one or more areas to etch from the second structural element to conform the second structural element substantially to the select second structural element topography.

The determination of an etching pattern signal includes the determination of a minimum etching-time signal. The etching-time signal represents a minimum length of time to apply a milling pattern in order to conform the second structural element substantially to the select second structural element topography. The determination of an etching pattern signal can further include the determination a minimum etching-area signal. The minimum etching-area signal represents a milling pattern having a minimum area to be removed for conforming the second structural element substantially to the select second structural element topography.

The generation of a milling signal can further include the generation of a representative instruction signal for deflecting said particle beam to a desired location. The generation of a milling signal can also include the generation of a representative instruction signal for moving the platform to a desired location.

Thus, the invention provides apparatus and methods that employ a focused particle beam system to mill a second structural element without irradiating a sensitive first structural element, e.g., a read head, of a recording transducer. In this manner, the focused particle beam system produces a desired pole-tip configuration. By producing a desired pole-tip configuration, the system produces an improved recording transducer capable of higher storage density than recording transducers made according to prior art techniques. Further, the system uses existing features of a multi-layer device that forms a recording transducer. A focused particle beam for practice of the invention can include an ion beam, electron beam, x-ray beam, optical beam or other similar source of directable radiant energy.

These and other features of the invention are more fully set forth with reference to the following detailed description, and the accompanying drawings.

DESCRIPTION OF ILLUSTRATED EMBODIMENTS

The invention provides improved apparatus and methods for employing a focused particle beam to manufacture the precise geometry of a pole-tip assembly to provide improved thin-film magnetic heads. More specifically, the invention provides apparatus and methods for milling a pole-tip assembly of a recording transducer without irradiating a sensitive structure, e.g., a read head, of the recording transducer. The following detailed description presents certain exemplary embodiments of the invention.

Figure 1:
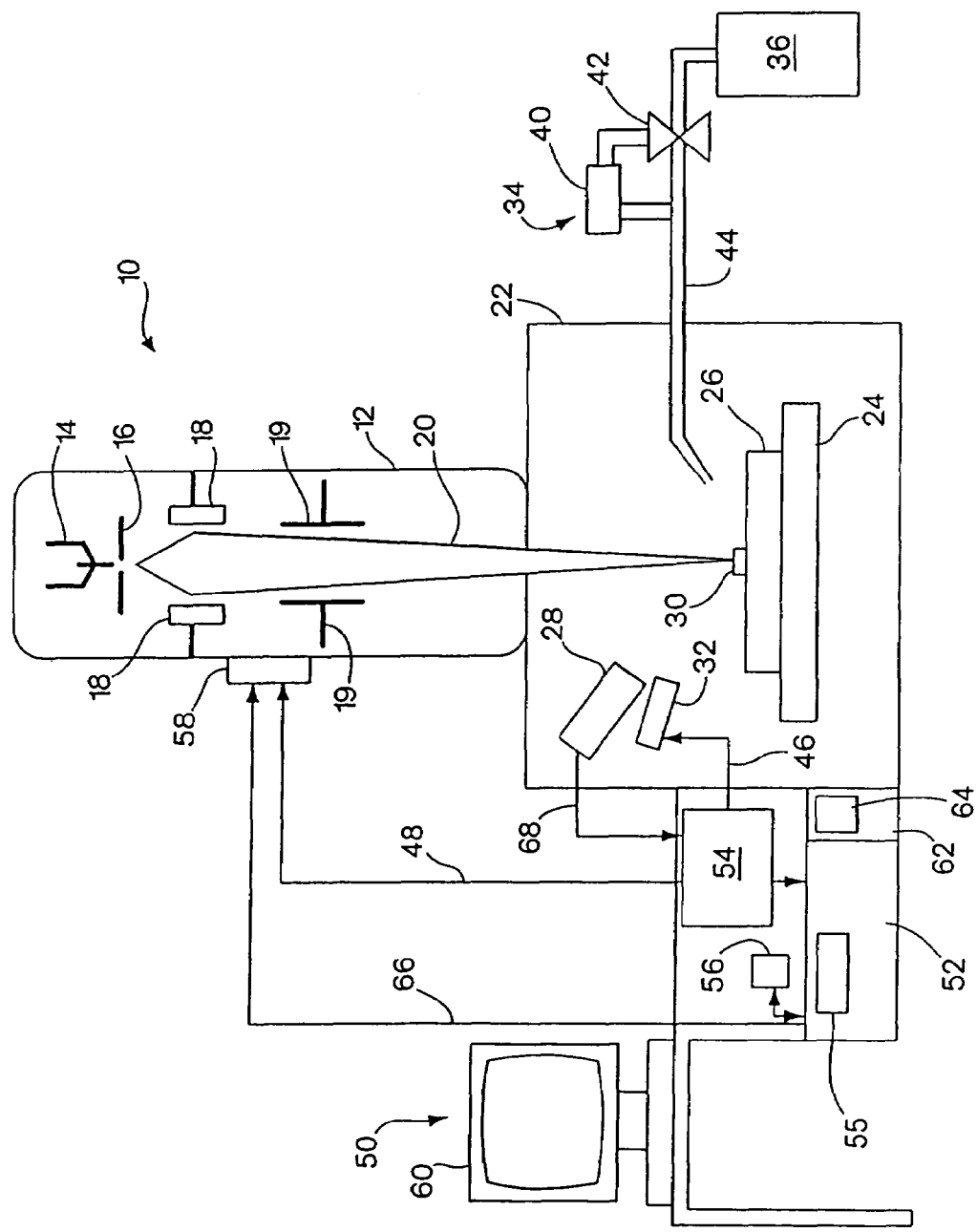
FIG. 1 depicts one system according to the invention for manufacturing thin-film magnetic recording transducers.

FIG. 1 depicts one focused particle beam system 10 according to the invention for manufacturing thin-film magnetic recording transducers. The system 10 of FIG. 1 includes an ion column 12, a vacuum chamber 22, a charge neutralization element 32, a secondary particle detector 28 and an optional reactant material delivery system 34.

The operation of the ion column 12, charge neutralization element 32, and secondary particle detector 28 are controlled by the user control station 50. The user control station 50 can include a processor element 52, a pattern recognition element 54, a memory element 46, a display element 60, a scan generator element 62, and dwell registers 64. The processor element 52 includes a location processor element 55.

The system 10 provides a focused particle beam system that can precisely mill thin film recording transducers, including thin film recording transducers having contoured surfaces. A focused ion beam system of this type is commercially available from Micrion Corporation of Peabody, Mass. A recording transducer formed by a multi-layer device is seated within the vacuum chamber 22 and operated on by a particle beam generated by the column 12 to mill the pole-tip assembly of the recording transducer. A recording transducer 72 of the type that can be seated within chamber 22 and processed by the system 10 is shown in FIG. 2 disposed for data-transfer with a rotating magnetic storage disk 70.

The illustrated read/write recording transducer 72 is disposed at the distal end of an arm 80 to sit just above the rotating disk 70. The read/write head records and reads digital data by generating or sensing magnetic states that form a data track 76.

Figure 2:
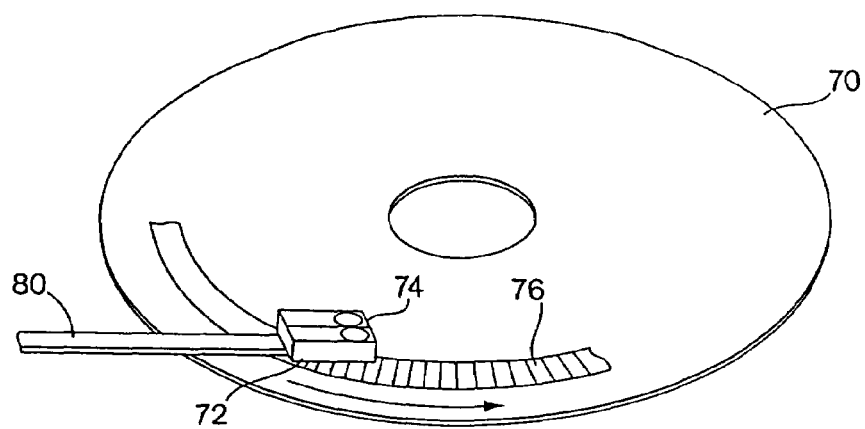
FIG. 2 depicts one thin-film magnetic recording transducer according to the invention disposed above a data track of a magnetic medium.
Figure 3:
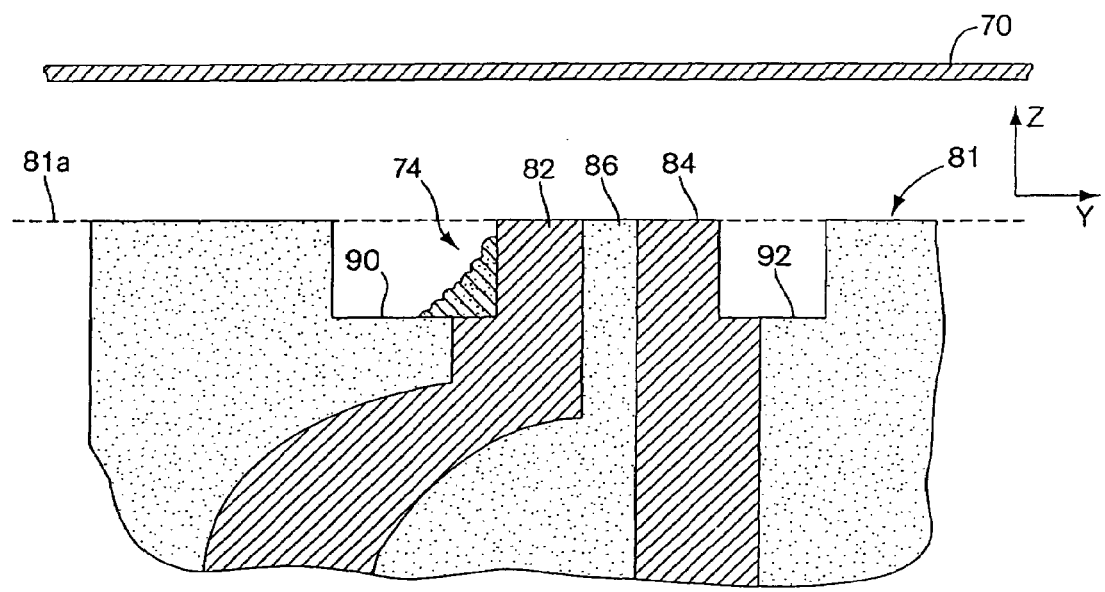
FIG. 3 depicts in more detail the pole-tip assembly of the recording transducer depicted in FIG. 2.

FIG. 3 depicts in greater detail the pole-tip assembly of the read write head 72 depicted in FIG. 2. The illustrated pole-tip assembly 74 has a first pole 82, a second pole 84, and a pole gap 86 interposed between the poles 82 and 84. The illustrated pole-tip assembly 74 further includes a recess surface 90 proximate the first pole 82, and a recess surface 92 proximate the second pole 84. The pole-tip assembly passes adjacent the magnetic storage disk 70.

The cross-sectional view provided by FIG. 3 illustrates that the poles 82 and 84 of the read/write head 74 extend into the substrate of the read/write head 74. FIG. 3 further depicts that the poles 82 and 84 are separated by the gap 86 that provides a separation between the poles. As is known in the art of thin film magnetic heads, the separation 86 between the two poles 82 and 84 causes a magnetic field pattern to form between the two poles and above the gap 86. In this way during the writing of digital data, the pole-tip assembly 74 generates a magnetic field that can induce a magnetic response within the magnetic media of disk 70, to form a confined magnetized area, or spot, within the disk 70. Similarly, a magnetic spot on the disk 70 produces a magnetic field. As the magnetic spot passes proximate to the pole-tips 82 and 84, the magnetic field generated by the spot on the disk 70 causes a magnetic response by the read head. The magnetic response is then detected by the magnetic recording transducer. In this way the recording transducer 72 can be employed to read magnetic data written on the disk 70.

Figure 4A:
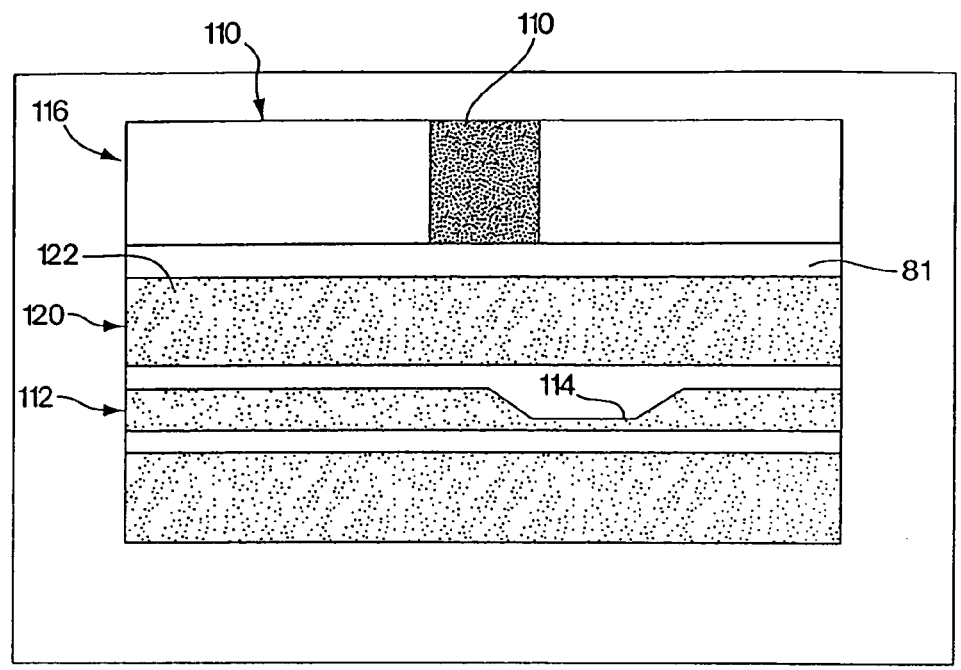
FIG. 4A shows a recording transducer in a multi-layer device as seen from the perspective of a magnetic recording medium.
Figure 4B:
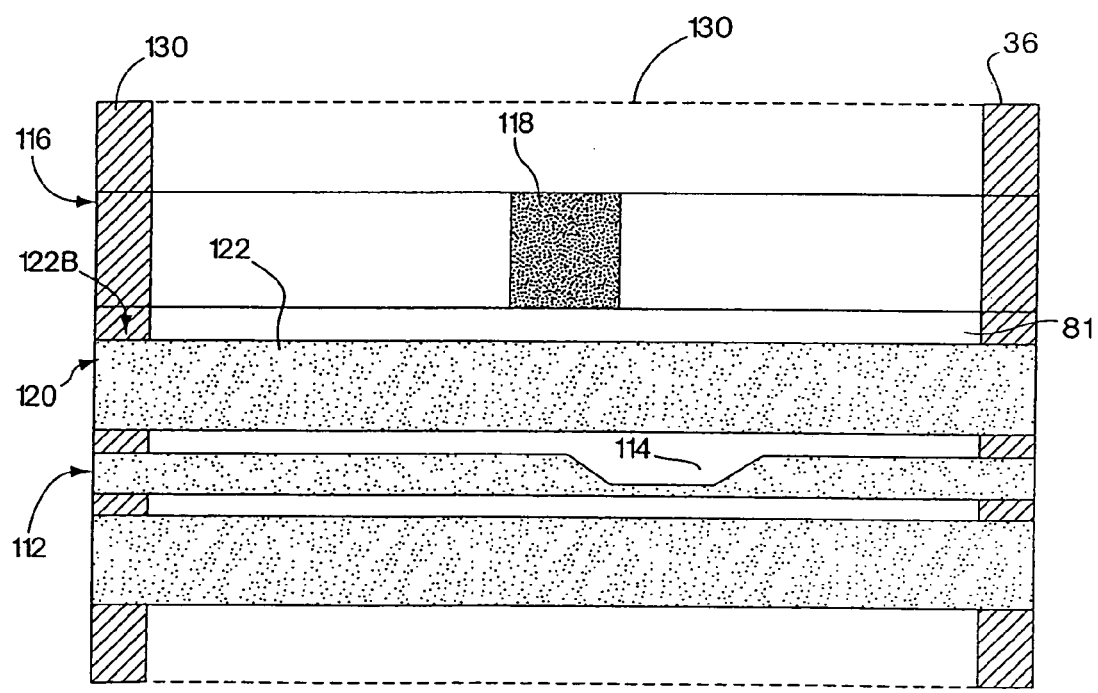
FIGS. 4B, 4C, and 4D show steps in a method, according to one embodiment of the invention, of milling the thin-film magnetic recording transducer of FIG. 4A using the system of FIG. 1.
Figure 4C:
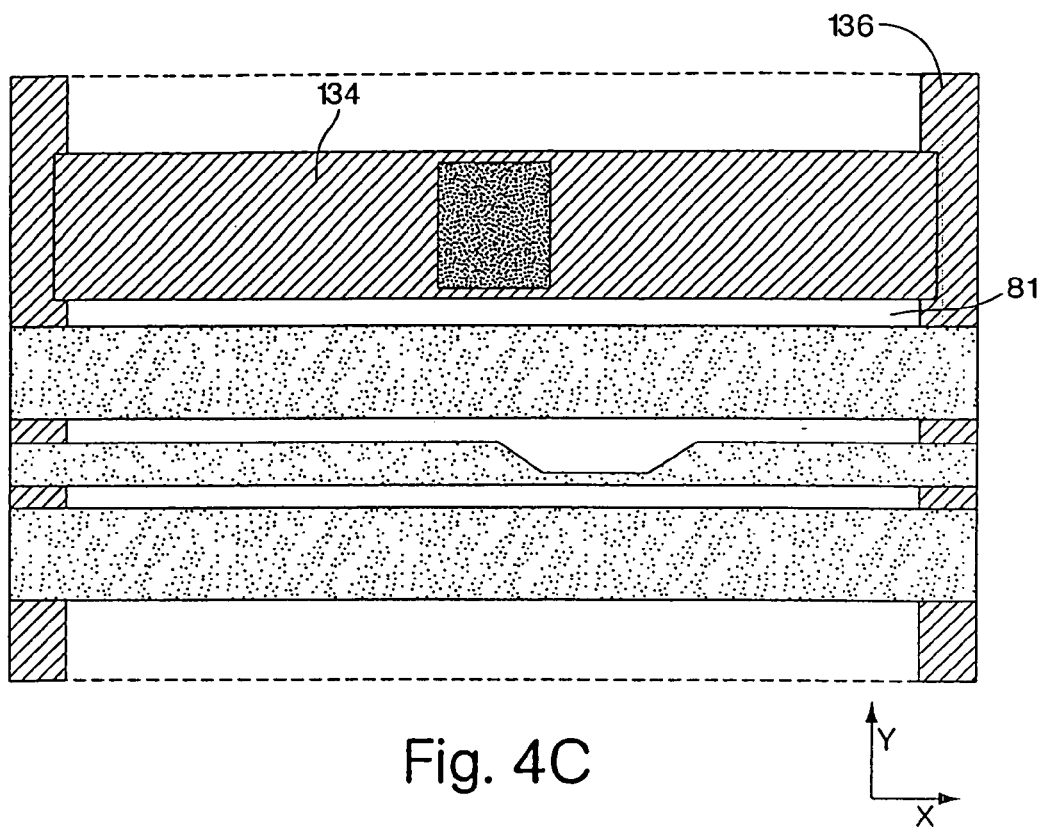
Figure 4D:
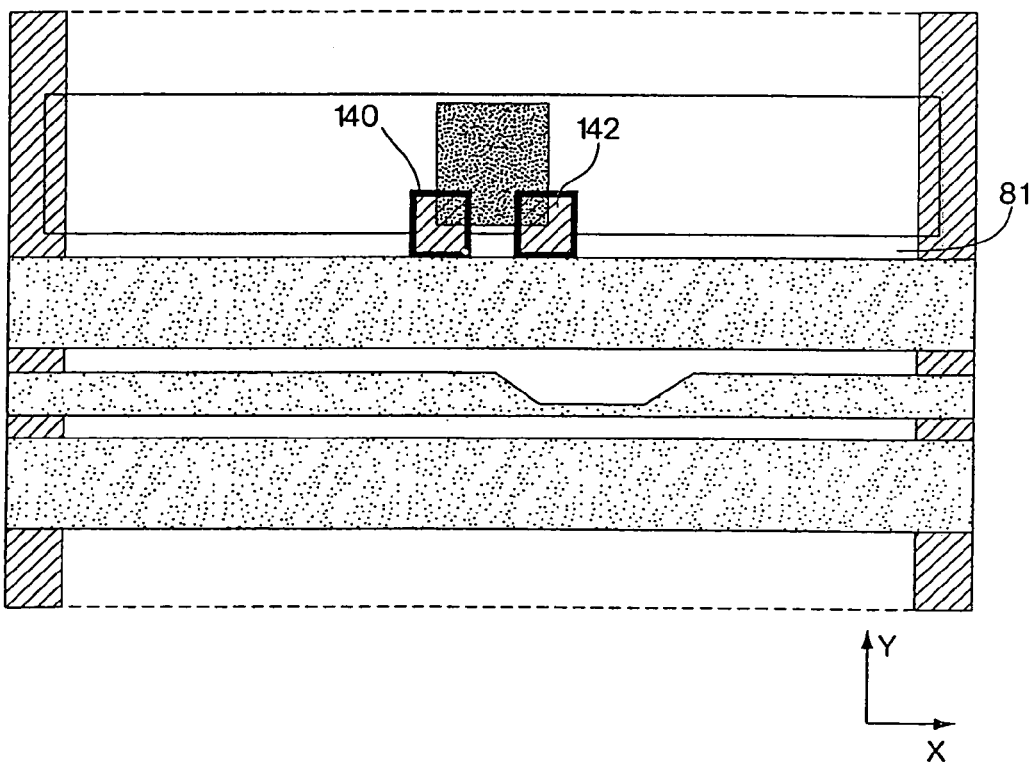
Figure 8:
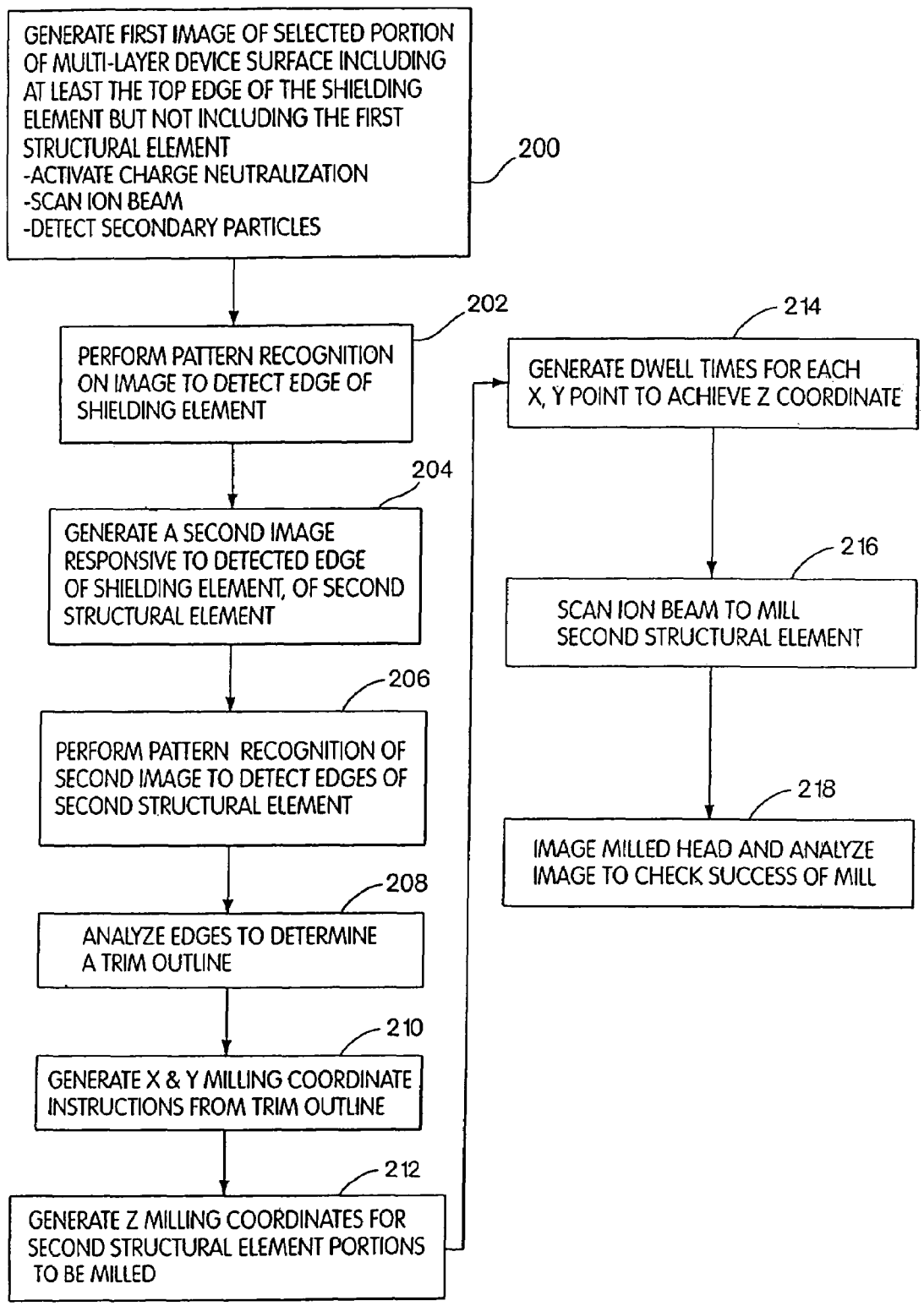
FIG. 8 is a flow chart illustration of one method according to the invention for manufacturing read/write heads.

FIGS. 4B, 4C, and 4D, illustrate sequential steps for manufacturing a thin-film recording transducer in one version of a method according to the present invention. FIG. 8 is a flow chart that illustrates one embodiment of the method illustrated in FIGS. 4B, 4C, and 4D. With reference to FIGS. 1-4D and 8, the method disposes a multi-layer device 110 that forms a recording transducer 74 on a platform 26 for contact with the particle beam 20. The multi-layer device 110, as shown in FIG. 4A, has a first layer 112 including a first structural element 114, a second layer 116 including a second structural element 118, and a shielding layer 120. The shielding layer 120 includes a shielding element 122 located between the first structural element 114 and the second structural element 118. In other words, the shielding layer 120 is between the first layer 112 and the second layer 116, and the shielding element 122 in the shielding layer 120 is between the first structural element 114 and the second structural element 118. The first structural element 114 and the second structural element 118 can be a read pole and a write pole, respectively, of a pole-tip assembly. A construction line 81a in FIG. 3 identifies a geometrical surface 81 that is shown also in FIG. 4A. The structural elements 114, 118 and the shielding element 122 intersect the geometrical surface 81. The geometrical surface extends transversely to the first, second, and shielding layers 112, 116, 120. Thus, imaging at least a portion of the shielding element 122, at the geometrical surface 81, provides information to facilitate imaging the second structural element 118 without requiring irradiation of the first structural element 114.

With reference again to FIGS. 1-4D, and 8, and with particular emphasis on FIG. 8, the illustrated method in operation 200 scans the focused particle beam 20 over the geometrical surface 81 at a selected portion that includes at least a first portion of the shielding element 122 and that does not include the first structural element 114. The method, in operation 200, generates a first image signal representative of the first portion of the shielding element 122. The first image signal results from interaction of the focused particle beam 20 with the first portion of the shielding element 122. The method, in operation 202, analyzes the first image signal of the first portion of the shielding element 122 to determine the location of the first portion of the shielding element 122.

The method, in operation 204, directs the focused particle beam 20, in response to the determined location of the portion of the shielding element 122, to interact with the second structural element 118 without substantially interacting with the first structural element 114. The method, in operation 204, generates a second image signal responsive to interaction of the focused particle beam 20 with the second structural element 118. The method, in operation 208, analyzes the second image signal of the second structural element 118 to determine the location and the shape of the second structural element 118. Then, the method, in operation 210, generates a milling signal, in response to the location and shape of the second structural element 118. The milling signal represents an instruction for applying the focused particle beam 20 to a selected portion of the second structural element 118 for shaping the pole-tip assembly by milling the selected portion of the recording transducer 30.

The scanning operation 200 is facilitated by the use of a cell. A cell describes a selected geometric area that the focused particle beam of the system is allowed to scan. A cell can also represent a set of actions, e.g., etching and imaging, that are performed within that selected geometric area. A cell can include the whole field of view (FOV) of the focused particle beam or any subset thereof. FIG. 4B shows a FOV cell 130 that spans the entire FOV of the focused particle beam. A second cell, e.g., cell 132, can be located within the FOV cell 130. Further, a second cell can be placed on top of, or adjacent to, a first cell.

A cell can be static or dynamic. A dynamic cell has the property that the shape, location, or function of the cell can be determined by a feature or structure found in, or action performed in, another cell. The process according to the invention wherein the shape and the function of a cell are set dynamically is termed dynamic selective imaging. One example of dynamic selective imaging is when a focused particle beam system according to the invention images a first section of a FOV and selects, based on what features or structures are found in the first section, a second section of the FOV to image.

A cell can be placed by a control system. In other words, a control system assists in creating a cell by controlling the electrostatic deflection of the focused ion beam. In other words, the specified control system causes the beam to impinge on that section of the substrate surface which constitutes the desired cell.

A linguistic or abstract description of a typical structure of interest, e.g., a write head, a read head, or a shielding element, is termed a model. A system according to the invention can search in a cell for features that correspond to one or more models. Different characteristics of a feature, such as the size and shape of the feature, can be used to match a feature found in a cell to a model. To determine the size and shape of a feature, the system searches for the edges of a feature located within a particular cell. To search for the edges of a feature, the system detects, among other things, the contrast between a feature and the background. PCT application serial number PCT/US97/06158 filed Apr. 16, 1997, entitled "Thin-Film Magnetic Recording transducers and Systems and Methods for Manufacturing the Same," by inventors C. Libby, D. Yansen, G. Athas, R. Hill, and R. Mello (attorney docket number MIM-049PC), incorporated herein by reference, describes inter alia, the use of pattern recognition in shaping a pole-tip assembly, and, more particularly, the use of pattern recognition in matching a feature to a model.

In addition, U.S. patent application Ser. No. 08/810,837 filed Mar. 4, 1997, entitled "Thin-Film Magnetic Recording transducer Manufacture," by C. Libby and R. Lee (attorney docket number MIM-056), incorporated herein by reference, describes, inter alia, incorporating at least one fiducial or reference mark in a multi-layer device to facilitate manufacturing of improved thin-film magnetic recording transducers. More specifically, the above-referenced application describes milling a second structural element without irradiating a first structural element by placing a first marker element, which can be imaged and/or damaged, in the same layer of a multi-layer lithographically fabricated device as the first structural element.

The marker element has a fixed spatial relationship to the first structural element. Thus, by imaging the first marker element and the second structural element, and knowing the separation between the first structural element and the first marker element, a focused particle beam system can determine the relative location of the first and second structural elements. Consequently, the focused particle beam system can determine, without irradiating the sensitive first structural element of a wafer with a marker element, which portions of the second structural element require milling. However, there remains a need for a system that can determine which portions of a second structural element require milling, without irradiating a sensitive first structural element of a multi-layer device containing a recording transducer, e.g., a wafer, when the multi-layer device does not include the marker element described above.

According to the present invention, selective imaging can be performed on thin-film heads, using a shielding element to indicate where to image a second structural element, without irradiating a first structural element. With reference to FIGS. 1, 3, 4B, 4C, and 4D, in one process according to the invention, the focused ion beam system 10 performs the following steps. 1) The system moves the ion column 12 so that the FOV consists of FOV cell 130 having a predetermined size, e.g. 10 microns by 10 microns. 2) The system 10 images a shielding element search cell 132 which is located within FOV cell 130. Using a known method, such as an optical microscope registration technique, the system selects a first section of the geometrical surface 81 that does not include the first structural element 114. Thus, as an example, the system images a vertical section on the far left side of the multi-layer device shown in FIG. 4B. 3) The system searches for a feature that matches a model 150, e.g., a shielding element model. Upon matching the feature to the model, the system locates the top edge 122b of the shielding element 122 within cell 132. 4) If a feature matching model 150 is not located, the system moves the cell 132 systematically, still avoiding irradiating the first structural element 114, and repeats steps 2 and 3 until the top edge 122b of shielding element 122 is located. 5) The system then places a second structural element search cell 134 above the shielding element 122, on the side of the shielding element opposite the first structural element 114. 6) The system images cell 134. 7) The system searches for model 152, e.g. a write pole model. 8) If a feature matching model 152 is not found, the system moves cell 134 systematically, still avoiding irradiating the first structural element 114, and repeats steps 7 and 8 until model 152 is found. 9) The system attaches trim boxes 140 and 142 to the second structural element 118, based, in part, on the image of the second structural element 118 in cell 134.

According to another embodiment of the invention, the focused ion beam system 10 performs selective imaging according to the following steps. 1) The system moves to cell 130, without imaging cell 130. 2) The system 10 images cell 132, which is located within cell 130, a selected distance from the first structural element. Cell 132 can be a tall, thin cell located in the periphery of cell 130, spanning the entire height of cell 130. 3) The system searches for model 150, a shielding element. Upon matching the feature to the model, the system locates the top edge 122b of the shielding element 122 within cell 132. 4) If a feature matching model 150 is not located, the system moves cell 132 systematically, still avoiding irradiating the first structural element 114, and repeats steps 2 and 3 until the top edge 122b of shielding element 122 is found. 5) The system 10 images cell 136, which is located within FOV cell 130, a selected distance from the first structural element 114. Cell 136 can be a tall, thin cell located in the periphery of cell 130, opposite cell 132, spanning the entire height of cell 130. 6) The system searches for a feature that matches model 150, e.g. a shielding element. Upon matching the feature to the model, the system locates the top edge 122b of the shielding element 122 within cell 136. 7) If a feature matching model 150 is not located, the system moves cell 132 systematically, still avoiding irradiating the first structural element, and repeats steps 5 and 6 until the top edge 122b of shielding element 122 is found. 8) The system places cell 134 above the shielding element 122, on the side of the shielding element opposite the first structural element 114. 9) The system images cell 134. 10) The system searches for a feature that matches model 152, e.g., a write pole model. 11) If a feature matching model 152 is not found, the system moves cell 134 systematically, still avoiding irradiating the first structural element 114, and repeats steps 9 and 10 until a second structural element is found. 12) The system attaches trim boxes 140 and 142 to the second structural element 118 based, in part, on the image of the second structural element 118.

With reference again to the illustrated embodiment of FIG. 1, the ion column 12 includes an ion source 14, an extraction electrode 16, a focusing element 18, deflection elements 19, and a focused ion beam 20. The ion column 12 sits above the vacuum chamber 22, and the vacuum chamber 22 houses a stage 24, a platform 26, a read/write head 30, a secondary particle detector 28, and a charge neutralization element 32. As further depicted by FIG. 1, the optional reactant material delivery system 34 includes a reservoir 36, a manometer 40, a motorized valve element 42, and delivery conduit 44. The user control station 50 can include a processor 52, a pattern recognition element 54, a memory element 46, a display element 60, a scan generator element 62, and dwell registers 64.

The operation of the ion column 12, charge neutralization element 32, and secondary particle detector 28 are controlled by the control station 50. The depicted control station 50 includes a processor element 52 that has a scan generator element 62 that includes dwell register 64. The processor element 52 couples via a transmission path to a control element 58 coupled to the ion beam column 12. The processor element includes a location processor element 55. The depicted processor element 52 can be a conventional computer processor element that includes a CPU element, a program memory, a data memory, and an input/output device. One suitable processor element 52 is a IBM Risc 6000 Workstation operating a Unix operating system.

As further depicted by FIG. 1, the processor element 52 can connect, via the input/output device to a scan generator element 62. In one embodiment, the scan generator element is a circuit card assembly that connects to the processor 52 via the processor input/output device. The circuit card assembly scan generator element 62 depicted in FIG. 1 includes a scan memory for storing data representative of a scanning pattern that can be implemented by system 10 for scanning ion beam 20 across the surface of the workpiece 30 to selectively mill, or etch the surface of the workpiece 30.

In this embodiment of the invention, the pattern recognition element 54 generates an image of a first portion of the surface of the recording transducer 30 and processes the image to determine the position of the shielding element or second structural element. The position of the shielding element or second structural element can be represented by a coordinate signal that can define, in one embodiment, the coordinates of the periphery of the shielding element or second structural element footprint relative to a predefined registration point. The use of predefined registration points, which act as landmarks, is known in the art of ion beam processing for manually positioning a workpiece during a preliminary step of a focused particle beam process. Other systems and methods for initializing the coordinate system employed by the pattern recognition system 54 can be practiced with the present invention without departing from the scope thereof.

The system 10 depicted in FIG. 1 includes a pattern recognition system 54 that connects via transmission path 48 to the depicted ion column 12, and further couples via transmission path 68 to the secondary particle detector 28 wherein transmission path 68 carries image data to the pattern recognition element 54, and further couples via transmission path 46 to the charge neutralization element 32 wherein transmission path 46 carries a control signal to the charge neutralization element 32 for activating and deactivating the charge neutralizer 32. In the depicted embodiment, the pattern recognition element 54 further connects via a bi-directional bus to the memory element 56 that acts as a computer memory element for storing data representative of known pole-tip feature footprint presentations.

In the embodiment depicted in FIG. 1, the pattern recognition system 54 employs the focused ion beam column 12 and the secondary particle detector 28 to generate an image of the surface of the recording transducer 30. Specifically, the pattern recognition element 54 generates a series of scanned control signals that are transmitted via transmission path 48 to the control element 58 of the ion column 12. The scanned control signals direct the control element 58 to scan the focused ion beam across the XY plane that defines the surface of the recording transducer 30 and particularly to scan the ion beam across the portion of the surface 30 that includes a feature of interest. The scanning of the ion beam 20 across the recording transducer surface 30 causes the emission of secondary particles, including secondary electrons and secondary ions. The secondary particle detector 28 detects the omitted secondary particles and provides an image signal 68 to the pattern recognition system 54.

The pattern recognition system 54 coordinates the image signal with the scanning signals that generate deflection signals that apply to the deflector elements 19 and correlates the image signal with the deflector signals so that changes in the detected signals are associated with particular deflection signals amplitudes corresponding to a particular location on the recording transducer surface 30. The detector 28 may be one of many types such as electron multiplier, micro channel plates, secondary ion mass analyzer, or photon detectors. Imaging techniques are described herein are well known in the art of focused ion beam processing and any substitutions, modifications, additions or subtractions to the imaging technique described herein is deemed to be within the scope of the invention. Preferably during the imaging process the pattern recognition element 54 generates a control signal transmitted via transmission path 46 to the charge neutralization element 32. The charge neutralization element 32 depicted in FIG. 1 is an electron gun element that directs a beam of electrons towards the surface of the recording transducer surface 30. The beam of electrons neutralizes a building static electric charge that arises on the recording transducer surface 30 during the imaging operation. By reducing the built-up electric static charge the charge neutralizer reduces the defocusing the ion beam and deflecting of the ion beam that results from the positive surface charge on the recording transducer 30 that defocuses and deflects the positively charged ion beam 20 scanning across the workpiece surface 30. Accordingly, the charge neutralizer element 32 allows the system 10 to generate more precise images of portions of the recording transducer pole-tip assembly.

The pattern recognition element 54 stores the image signal representative of the image of a portion of the recording transducer and a computer memory that forms part of the pattern recognition element 54. The pattern recognition element 54 includes a pattern recognition processor such as one manufactured and sold by the Cognex Corporation of Needham, Mass. Further, the pattern recognition system 54 can supply the image signal of at least a portion of the recording transducer surface to the display 60 for displaying the portion to the system user.

The pattern recognition element 54 analyzes the image signal stored in the recognition element computer memory.

In one embodiment of the invention, the pattern recognition element 54 employs an edge detection technique to identify portions of the image signal representative of the edges of the footprint of a feature of interest. The edge signal provides precision information as to the location of the feature relative to a known registration point of the system 10. Accordingly, the system 10 can employ the detected edge to define precisely the location of the feature.

In a further embodiment, the pattern recognition element 54 identifies each edge of the footprint of a feature. The recognition element processes these detected edges to extract feature information from the image signal. The features typically represent geometric patterns, such as squares, curves or other geometric shapes that represent an outline of a portion of the pole-tip assembly. The geometric signals that are formed from the edge signals provide precise coordinate information as to the location of the features of interest. The feature extraction element of the pattern recognition element 54 can be a signal processing program stored in a program memory of the pattern recognition element 54 and implemented by the pattern recognition processor element. The feature extraction code analyzes the location information of each detected edge to identify sets of matched coordinates between different detected edges. A matched set of coordinates identifies an intersection between two edges. The feature extraction element employs the edges and intersection points to identify the geometric pattern formed by the detected edges. One such geometric pattern could describe a write pole of a pole-tip assembly.

As depicted in FIG. 1, the pattern recognition system 54 connects via a transmission path to the processor element 52 and includes an interface for transmitting to the processor element 52 the geometric pattern information. It will be apparent to one of ordinary skill in the art of electrical engineering that information signals can be represented as electronic digital data signals suitable for transmission across electrical transmission lines.

In one embodiment, the processor 52 includes a trim outline element that employs the geometric pattern information of the write head to generate a geometric pattern or trim outline that represents a selected portion of the write head that is to be milled. The processor 52 generates from this trim outline a series of milling instructions that are transmitted via transmission path 66 to the control element 58 of the ion column 12. The milling instructions can include deflection signals that cause the deflection elements 19 to scan across the surface of the recording transducer 30 according to the geometric pattern determined by the processor 52. In this way, the processor 52 generates milling instructions that direct the ion beam 20 to etch away a selected portion of the recording transducer 30.

The processor element 52 can find features that vary in size and position. The processor element 52 can apply a trim outline to the actual features found. The placement and size of the trim outline is determined by "pinning" edges of the template to edges of the outline that the pattern recognition element has found.

The processor's pinning operation can be understood as a logical attachment of a trim outline edge to the outline of the feature that the pattern recognition element has found. This attachment will allow the trim outline to correspond to a particular feature. Pins can cause a trim outline to "shrink wrap" around a portion of the detected feature.

In addition the system can apply constraints. A constraint is a required fixed dimension between two trim outlines. A constraint overrides any pin actions. If a desired pole-tip configuration requires a specific dimension, which is often the case, a constraint may be applied to ensure that, as a result of pinning, the required dimension remains intact. Accordingly, a milling pattern made up of adaptable trim outlines can adapt to produce a desired read/write head configuration. In other words, by using pins and constraints, similar patterns or features can be milled from features of varying configurations.

As will be seen from the above description, the system 10 depicted in FIG. 1 provides a system for manufacturing thin-film magnetic read/write heads that automatically identifies the location and geometry of a second structural element, and generates, from the location and geometry, a set of milling signals that direct the focused particle beam to mill the recording transducer and thereby form a pole-tip assembly that has the precise geometry suitable for generating a selected magnetic field pattern. One such operation is illustrated in FIGS. 4B, 4C, and 4D.

In the depicted embodiment, a registration post is disposed sufficiently far from the pole-tip assembly of the recording transducer that a first image is taken with sufficiently low magnification as to generate an image that encompasses both the registration post and a portion of the read/write head. In a subsequent step, the pattern recognition element 54 generates a second image that represents, at a higher magnification, the pole-tip assembly 100 of the read/write head. At such a high magnification, the registration post does not appear within the borders of the image.

The pattern recognition element 54 passes the geometric pattern information depicted in FIG. 4C to the processor element 52. The processor element 52 generates a trim outline signal, depicted in FIG. 4D, that includes a first trim outline 140 and a second trim outline 142, each of which represents geometric patterns superimposed over the image of the pole-tip assembly 100. Each trim outline 140 and 142 further represents a selected portion of the recording transducer to be removed by the ion milling process. In the depicted embodiment, the trim outlines 140 and 142 of FIG. 4D identify two etching areas that will selectively remove portions of the second structural element.

Figure 5:
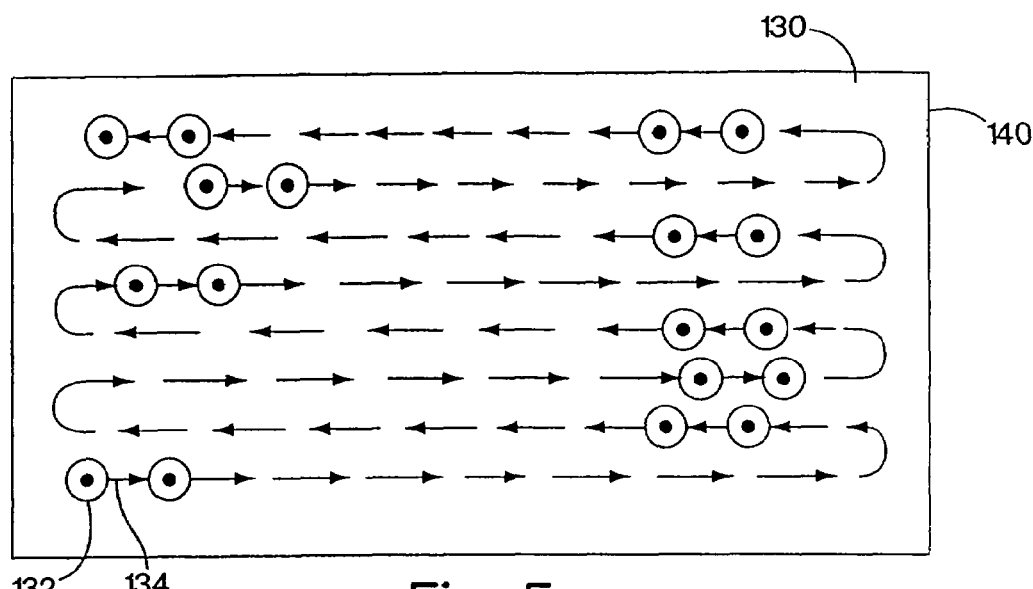
FIG. 5 depicts a digital raster milling process suitable for practice by the system depicted in FIG. 1.

The processor 52 generates from the trim outline signals 140 and 142 a set of milling instructions for directing the particle beam 20 to mill the surface of the recording transducer 30. In one embodiment, the processor 52 generates a series of milling instructions for operating the ion column 12 to implement a digital raster pattern as depicted in FIG. 5. FIG. 5 illustrates a digital raster pattern 130 that comprises a series of pixel locations 132, each corresponding to the spot size of the ion beam 20, and separated by a pitch 134 which in the depicted digital raster pattern 130 is similarly sized to the beam spot size, and preferably small enough to allow for overlap during the milling process. One such beam spot size is approximately 0.7 microns. As depicted in FIG. 5, the processor element 52 therefore generates from the trim outline 140 a set of milling instructions which represent the X and Y locations for directing the particle beam 20 to mill the surface of the recording transducer 30 and remove the portion of the recording transducer outlined by the trim outline signal 140.

Figure 6A:
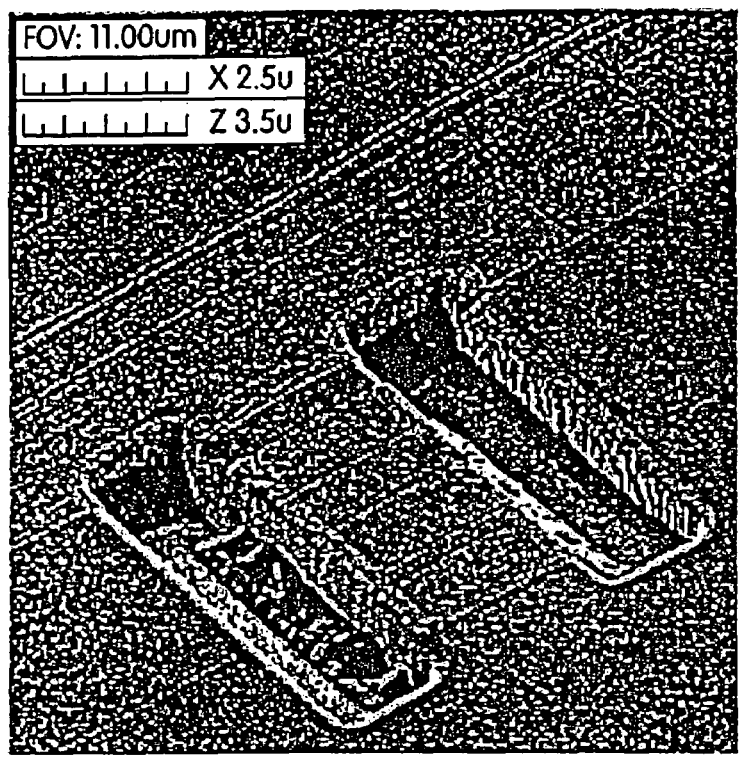
FIGS. 6A and 6B depict a write head of a magnetoresistive recording transducer before and after processing by a FIB system of the type depicted in FIG. 1.
Figure 6B:
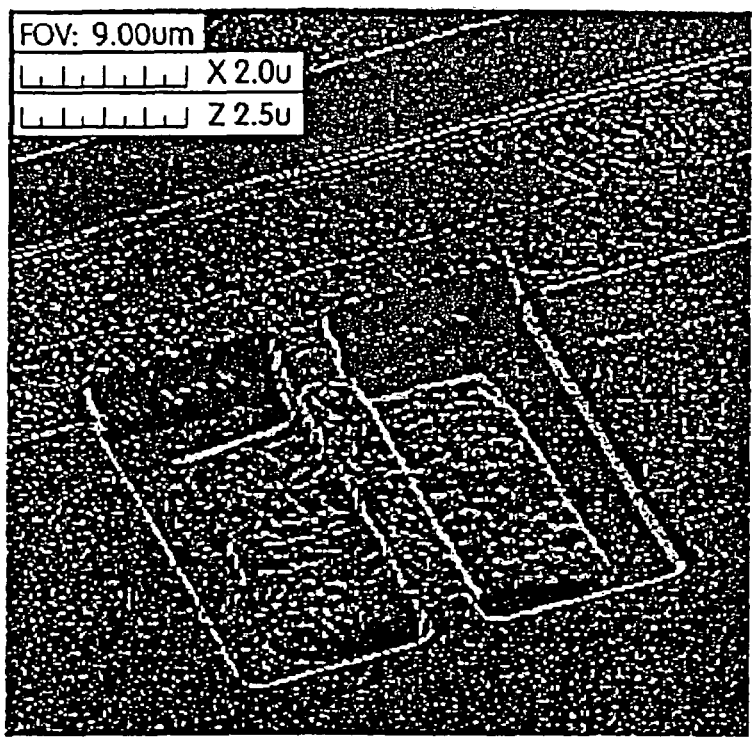

FIGS. 6A and 6B depict a magnetoresistive head before and after being milled by a system according to the invention to selectively remove portions of the recording transducer surface. As depicted by FIG. 6B, the focused particle beam has removed two rectangular portions from either side of the write head and part of the upper shield to reduce the track width. One of the concerns with milling these devices is protecting the electrically sensitive magnetoresistive sensors from electrostatic discharge (ESD) damage. Each milled portion depicted in FIG. 6B corresponds to the depicted trim outlines 140 and 142 depicted in FIG. 4D. In the embodiment illustrated in FIGS. 6A and 6B, the milling signals generated by the processor 52 direct the particle beam 20 to mill the workpiece to substantially the same depth over the entire portion of the trim outline. Accordingly, the write pole has an upper surface and a recessed lower surface.

Figure 7:
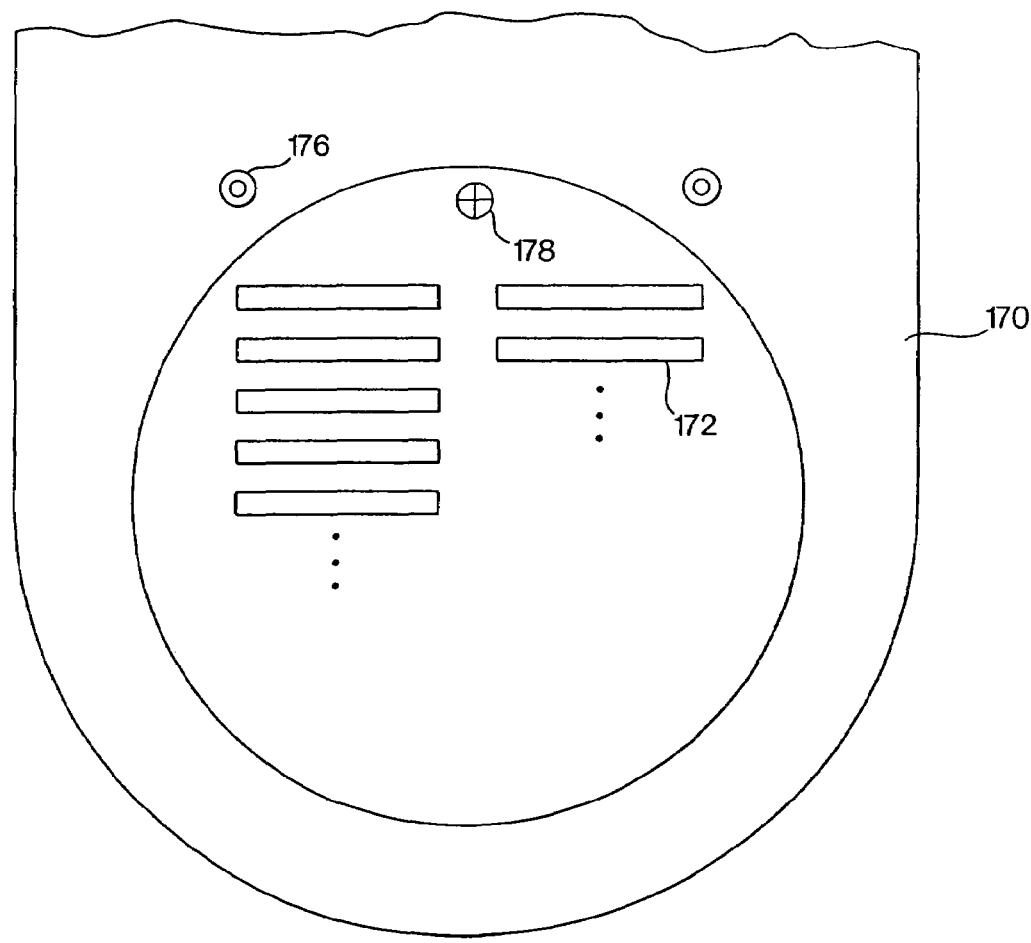
FIG. 7 depicts a delivery tray for delivering plural read/write heads to the system depicted in FIG. 1.

FIG. 7 depicts a delivery tray 170 suitable for practice with the present invention that provides plural recording transducers to be processed by the system 10. The delivery tray 170 includes registration posts 174, 176, and 178 that can be employed by the pattern recognition element 54 for determining the precise coordinates of the pole-tip assemblies and the first structural elements, e.g., the read heads, on the recording transducers 172. Accordingly, systems according to the invention provide precision milling of pole-tip assemblies for plural recording transducers. Accordingly, systems according to the invention are suitable for high volume manufacturing of thin-film magnetic read/write heads having pole-tip assemblies with precise features.

As apparent from the above description, the invention provides improved systems and methods for forming thin film recording transducers and for employing a focused particle beam to manufacture thin-film recording transducers. Those skilled in the art of thin film recording manufacturing techniques will appreciate that changes can be made to the embodiments and processes described above without departing from the broad inventive concept thereof. It will further be understood therefore, that the invention is not to be limited to the particular embodiments disclosed herein but is intended to cover modifications within the spirit and scope of appended claims.

Having described the invention, what is claimed as new and secure by Letters Patent is:

1. A method of using a charged particle beam system to process a substrate including a first structural element that can be damaged by being irradiated by the charged particle beam and a second structural element, near the first structural element, to be processed by the charged particle beam, comprising:

scanning a first region of the surface of the substrate with the charged particle beam to generate a first image of the first region, the first region including neither the first structural element nor the second structural element;

performing pattern recognition on the first image to automatically identify the location and geometry of an identifiable feature in the first region, the identifiable feature being neither the first structural element nor the second structural element;

automatically generating, from the location and geometry of the identifiable feature of the surface, a set of signals that directs the focused particle beam to the second structural element; and automatically processing the second structural element by charged particle beam irradiation, the charged particle beam automatically locating and processing the second structural element without irradiating the nearby first structural element.

2. The method of claim 1 in which automatically generating, from the location and geometry of the identifiable feature of the surface, a set of signals that directs the focused particle beam to the second structural element includes:

generating a set of signals to direct the charged particle beam to interact with a second region, the second region including the second structural element and not including the first structural element; and analyzing a second image generated by the interaction of the charged particle beam with the second region to determine the shape and location of the second structural element.

3. The method of claim 2 in which scanning a first region of the surface of the substrate includes a region that includes multiple layer.

4. The method of claim 3 in which scanning the type of processing of the second structural element is determined by the system based on the identifiable feature found in a cell.

5. The method of claim 1 in which the substrate comprises a multi-layer device oriented such that multiple layers are exposed to the charged particle beam and in which the first structural element and the second structural element are in different layers.

6. The method of claim 1 in which performing pattern recognition on the first image to automatically identify the location and geometry of an identifiable feature includes searching for edges of a feature located in the scanned region.

7. Process according to claim 2 wherein said step of automatically processing the second structural element includes generating, responsive to the analysis of the second image signal, a coordinate signal representative of an instruction for applying said focused particle beam to a selected portion of said second structural element for shaping an assembly by milling said selected portion of said susbtrate.

8. A process according to claim 7 wherein said step of generating a coordinate signal includes detecting an edge of said second structural element and generating an edge signal representative of a location of said edge of said second structural element relative to said charged particle beam.

9. A process according to claim 1 including the further step of providing charge neutralization means for neutralizing charge on the substrate.

10. A process according to claim 1 wherein said step of automatically processing the second structural element includes generating milling signals, as a function of said second image, a presentation signal representative of a pattern presentation of said second structural element.

11. A process according to claim 10 wherein said step of generating milling signals includes comparing said presentation signal to a pattern signal representative of a select second structural element topography.

12. A process according to claim 11 wherein said step of comparing said presentation signal to said pattern includes determining an etching pattern signal representative of one or more areas to etch from said second structural element to conform said second structural element substantially to said select second structural element topography.

13. A process according to claim 12 wherein said step of determining an etching pattern signal includes determining a minimum etching-time signal representative of a milling pattern having a minimum length of time for conforming said second structural element substantially to said select second structural element topography.

14. A process according to claim 12 wherein said step of determining an etching pattern signal includes determining a minimum etching-area signal representative of a milling pattern having a minimum area to be removed for conforming said second structural element substantially to said select second structural element topography.

15. A process according to claim 10 wherein said step of generating milling signals includes comparing said presentation signal to a plurality of said pattern signals and selecting one of said pattern signals as a function of said comparison.

16. A process according to claim 1 wherein said step of automatically processing the second structural element includes generating milling signals includes generating an instruction signal representative of a location for deflecting said particle beam.

* * * * *